United States Patent
Leobandung

(10) Patent No.: US 12,389,811 B2
(45) Date of Patent: Aug. 12, 2025

(54) MULTI FUNCTION SINGLE VIA PATTERNING

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 809 days.

(21) Appl. No.: 16/188,532

(22) Filed: Nov. 13, 2018

(65) Prior Publication Data

US 2020/0152871 A1   May 14, 2020

(51) Int. Cl.
H10N 70/00 (2023.01)
H10B 63/00 (2023.01)
H10N 70/20 (2023.01)

(52) U.S. Cl.
CPC ........... *H10N 70/068* (2023.02); *H10B 63/30* (2023.02); *H10B 63/80* (2023.02); *H10N 70/231* (2023.02); *H10N 70/826* (2023.02); *H10N 70/8413* (2023.02)

(58) Field of Classification Search
None
See application file for complete search history.

(56) References Cited

U.S. PATENT DOCUMENTS

| | | | |
|---|---|---|---|
| 7,852,658 B2 * | 12/2010 | Liu | H01L 45/1233 365/148 |
| 8,796,660 B2 * | 8/2014 | Takagi | H01L 27/101 257/2 |
| 8,872,149 B1 | 10/2014 | Hsieh et al. | |
| 9,831,288 B2 | 11/2017 | Grenouillet et al. | |

(Continued)

FOREIGN PATENT DOCUMENTS

WO   2018004588   1/2018

OTHER PUBLICATIONS

Lv et al., "BEOL Based RRAM with one extra-mask for low cost, highly reliable embedded application in 28 nm node and beyond." In 2017 IEEE International Electron Devices Meeting (IEDM), pp. 2-4 2017.

(Continued)

*Primary Examiner* — Mohsen Ahmadi
*Assistant Examiner* — Christopher A Culbert
(74) *Attorney, Agent, or Firm* — Samuel A. Waldbaum

(57) ABSTRACT

Various methods and structures for fabricating a semiconductor structure with vertical vias interconnecting BEOL metallization layers. A first BEOL metallization layer includes a first metallization contact. A second BEOL metallization layer is disposed on the first BEOL metallization layer. The second BEOL metallization layer includes a second metallization contact. A dielectric layer is vertically interposed between the first and second metallization layers. A first vertical via interconnects, through the dielectric layer, the first and second metallization contacts. In the first (Continued)

vertical via, a phase change material non-volatile memory (PCM) is vertically interposed between an upper electrode and a lower electrode. The lower electrode is electrically connected to the first metallization contact. The upper electrode is electrically connected to the second metallization contact.

16 Claims, 17 Drawing Sheets

(56) References Cited

U.S. PATENT DOCUMENTS

| | | | |
|---|---|---|---|
| 2008/0247226 A1* | 10/2008 | Liu | H01L 27/2409 365/163 |
| 2008/0296554 A1* | 12/2008 | Lee | H01L 27/2463 257/4 |
| 2009/0065761 A1 | 3/2009 | Chen et al. | |
| 2009/0236583 A1 | 9/2009 | Kuo et al. | |
| 2010/0072453 A1* | 3/2010 | Jeong | H01L 45/1233 257/5 |
| 2010/0105169 A1* | 4/2010 | Lee | H01L 24/11 438/107 |
| 2014/0138605 A1 | 5/2014 | Tan et al. | |
| 2015/0280115 A1 | 10/2015 | Zheng | |
| 2016/0204002 A1 | 7/2016 | Wallace et al. | |
| 2016/0343721 A1 | 11/2016 | Briggs et al. | |

OTHER PUBLICATIONS

Shahrabi et al., "Chip-level CMOS co-integration of ReRAM-based non-volatile memories." In 12th IEEE Conference on Ph. D. Research in Microelectronics and Electronics (PRIME), 2016, pp. 1-4 2016.

Shenoy et al., "Endurance and scaling trends of novel access-devices for multi-layer crosspoint-memory based on mixed-ionic-electronic-conduction (MIEC) materials." In 2011 Symposium on VLSI Technology (VLSIT), , pp. 94-95 2011.

* cited by examiner

MULTI FUNCTION SINGLE VIA PATTERNING

BACKGROUND

The present invention generally relates to the field of semiconductors, and more particularly relates to a method of fabricating metallization structures, BEOL metallization layers, and the like, on semiconductor substrates.

Semiconductor wafers, chips, devices, and the like, whether including analog or digital electronic circuits, typically rely on at least one metallization layer disposed on a semiconductor substrate to provide electronic interconnections between circuits on the semiconductor substrate or layer. Some circuit designs use a plurality of metallization layers stacked on top of one another. A metallization layer may also be referred to as a back-end-of-line (BEOL) metallization layer which could be disposed on a semiconductor material stack. Semiconductor contacts in a top layer in the semiconductor material stack are electrically connected to metal contacts and metal interconnects in a metallization layer disposed on the semiconductor material stack.

As chip designs continue to miniaturize on-chip electronic device dimensions to increase feature density, such chip designs attempt to locate electronic devices, and accordingly device features, closer and closer to each other on a semiconductor chip. As device features are located closer to each other, the respective metal interconnection wires are smaller widths and separated from each other by smaller pitch values and tighter pitch tolerances (pitch variability), to meet chip design requirements.

Scaling circuit designs to smaller physical layouts is getting more difficult because of the conflict between design requirements and layout restrictions. Limitations of metallization layer design, at continuously smaller scale circuit designs, have created a challenge for circuit designers and for semiconductor fabrication process designers to continue to meet further miniaturization goals. In order to resolve such difficulties and limitations, new semiconductor fabrication process elements and semiconductor structures will be required.

SUMMARY OF THE INVENTION

Various embodiments of the present invention include fabrication of semiconductor structures comprising: a semiconductor stack disposed on a substrate. A first BEOL metallization layer is disposed on the semiconductor stack, the first metallization layer including a first metallization contact. A second BEOL metallization layer is disposed on the first BEOL metallization layer. The second BEOL metallization layer includes a second metallization contact. A dielectric layer is vertically interposed between the first and second metallization layers. A first vertical via interconnects, through the dielectric layer, the first and second metallization contacts. In the first vertical via, a phase change material non-volatile memory (PCM) is vertically interposed between an upper electrode and a lower electrode. The lower electrode is electrically connected to the first metallization contact. The upper electrode is electrically connected to the second metallization contact.

In certain embodiments of the invention, the first vertical via includes an upper via portion disposed on top of a lower via portion, and wherein the upper via portion comprises upper vertical sidewalls tapered downward at a first tapering rate from the second metallization contact to a start of the lower via portion and the lower via portion comprises lower vertical sidewalls tapered downward at a second tapering rate to the first metallization contact. The first tapering rate is greater than the second tapering rate.

According to various embodiments of the invention, a second vertical via, separate from the first vertical via, vertically interconnects through the dielectric layer a third metallization contact in the first metallization layer with a fourth metallization contact in the second metallization layer. The first and second vertical vias, according to certain embodiments, are located adjacent to each other.

According to various embodiments, provided is a first example method for fabricating a vertical via interconnection between first and second BEOL metallization layers of a semiconductor structure, the method comprising: providing a semiconductor stack disposed on a substrate, a first BEOL metallization layer disposed on the semiconductor stack, the first BEOL metallization layer including a first metallization contact, a dielectric layer (dielectric cap layer) disposed on the first BEOL metallization layer, and a second BEOL metallization layer disposed on the dielectric layer; performing a first vertical via etch in the second BEOL metallization layer, through the dielectric layer, and to a top surface of the first metallization contact, to form a first vertical via trench; performing deposition in the first vertical via trench of a lower electrode electrically connected with the first metallization contact, a phase change material non-volatile memory (PCM) deposited on the lower electrode, and an upper electrode deposited on the PCM, the PCM being vertically interposed between the upper electrode and the lower electrode; and performing deposition of a fill metal in the first vertical via trench on the upper electrode, filling the first vertical via trench and thereby forming a second metallization contact in the second BEOL metallization layer.

According to the first example, the method may further include: performing a second vertical via etch in the second BEOL metallization layer, through the dielectric layer, and to a top surface of a third metallization contact in the first BEOL metallization layer, to form a second vertical via trench, separate from the first vertical via trench; and performing deposition of a fill metal in the second vertical via trench on the top surface of the third metallization contact, filling the second vertical via trench and thereby forming a fourth metallization contact in the second BEOL metallization layer.

Additionally, provided is a second example method for fabricating a vertical via interconnection between first and second BEOL metallization layers of a semiconductor structure, the method comprising: providing a semiconductor stack disposed on a substrate, a first BEOL metallization layer disposed on the semiconductor stack, the first BEOL metallization layer including a first metallization contact, a dielectric layer disposed on the first BEOL metallization layer, and a second BEOL metallization layer disposed on the dielectric layer; performing a first vertical via etch in the second BEOL metallization layer, to form a first vertical via trench; forming vertical sidewall spacers on upper vertical sidewalls of an upper via portion of the first vertical via trench in the second BEOL metallization layer; performing, in the first vertical via trench between the vertical sidewall spacers, a second vertical via etch, in the second BEOL metallization layer and through the dielectric layer to a top surface of the first metallization contact, thereby forming lower vertical sidewalls in a lower via portion of the first vertical via trench; stripping the vertical sidewall spacers from the first vertical via trench, leaving the upper vertical sidewalls in the upper via portion tapered downward at a first tapering rate to a start of the lower via portion and the lower vertical sidewalls in the lower via portion being tapered downward at a second tapering rate, the first tapering rate being greater than the second tapering rate; performing deposition in the first vertical via trench of a lower electrode electrically connected with the first metallization contact, a phase change material non-volatile memory (PCM) deposited on the lower electrode, and an upper electrode deposited on the PCM, the PCM being vertically interposed between the upper electrode and the lower electrode; and performing deposition of a fill metal in the first vertical via trench on the upper electrode, filling the first vertical via trench and thereby forming a second metallization contact in the second BEOL metallization layer.

According to the second example, the method may further include: performing a second vertical via etch in the second BEOL metallization layer, through the dielectric layer, and to a top surface of a third metallization contact in the first BEOL metallization layer, to form a second vertical via trench, separate from the first vertical via trench; and performing deposition of a fill metal in the second vertical via trench on the top surface of the third metallization contact, filling the second vertical via trench and thereby forming a fourth metallization contact in the second BEOL metallization layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
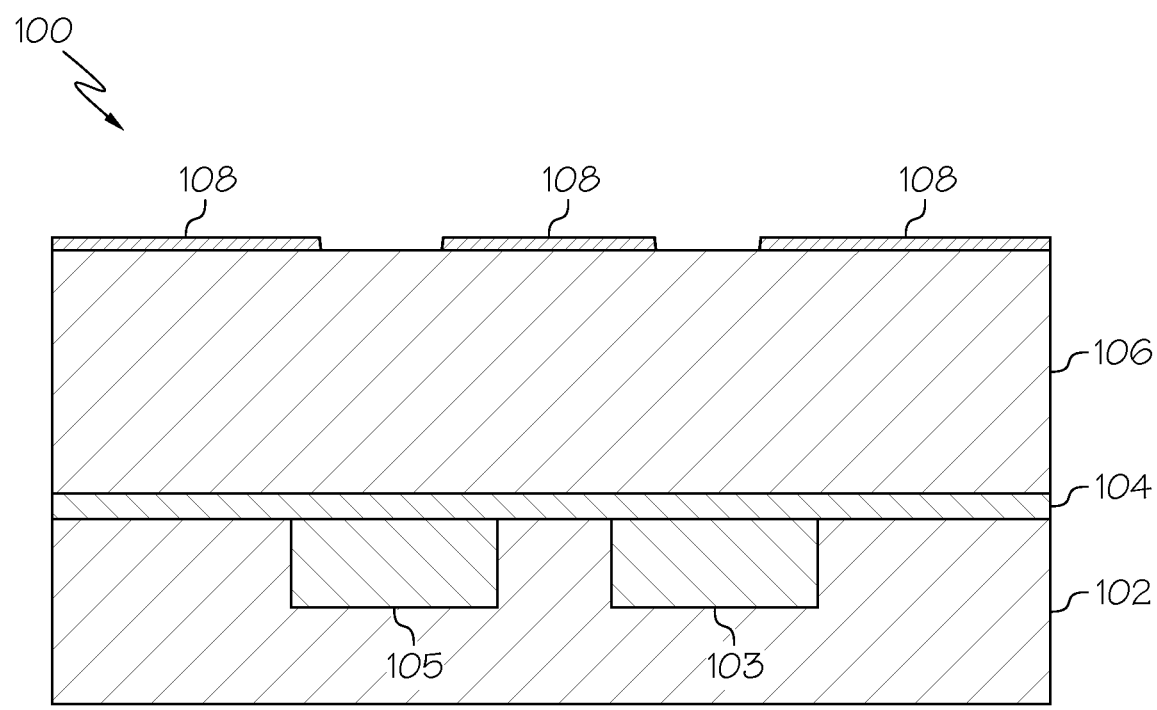
FIG. 1 is a cross-sectional side view of an example of a partial semiconductor structure illustrating a material stack that can be used in an example fabrication process, according to a first embodiment of the invention.

It is to be understood that the present invention will be described in terms of illustrative example processes for fabricating semiconductor structures and metallization layers in semiconductor chips and wafers. However, many other semiconductor architectures, structures, substrate materials, and process features and steps may be varied within the scope of the present invention.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. Such integrated circuit chips can include analog circuits and devices, digital circuits and devices, or any combination of analog and digital circuits and devices. Such integrated circuit chips may exist in many different embodiments. For example, integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, discrete semiconductor electronic devices, or other signal processing devices, or any combination thereof, as part of either (a) an intermediate product, such as a motherboard or component module, or (b) an end product. The end product can be any product that includes semiconductor integrated circuits and/or CMOS integrated circuits, ranging from toys and other low-end applications to advanced computer products and mobile phone devices having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use analog circuits, CMOSs, MOSFETs and/or finFETs technology. By way of non-limiting example, the semiconductor devices can include, but are not limited to analog, CMOS, MOSFET, and finFET devices, and/or semiconductor devices that use analog circuits, CMOS, MOSFET and/or finFET technology.

As used herein, "vertical" refers to a direction perpendicular to a substrate in the cross-sectional and three-dimensional views herein. Current between electronic contacts, whether semiconductor or metal contacts, may be described herein as flowing in a vertical direction (e.g., between a bottom contact or layer and a top contact or layer) through metal interconnection wire. As used herein, "horizontal" refers to a direction parallel to a substrate in the cross-sectional and three-dimensional views herein.

As used herein, "thickness". "thick", or the like, refers to a size of an element (e.g., a layer, trench, via hole, etc.) in the cross-sectional views measured from a bottom surface to a top surface, or from a left side surface to a right side surface of the element, and/or measured with respect to a surface directly adjacent to and contacting the element (e.g., a surface on which the element is directly disposed on).

Unless otherwise specified, as used herein, "height" or "height above a substrate" refers to a vertical size of an element (e.g., a layer, trench, via hole, etc.) in the cross-sectional views measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, etc.), such as a left or right side surface in the cross-sectional views herein.

As used herein, the terms "width" or "width value", and the like, refer to a distance from a start point on a first structure to an end point on the same structure, in a critical dimension. There can be specified a vertical width (e.g., a thickness) of the structure or a horizontal width of the structure.

The inventors have discovered that a vertical via structure, such as to interconnect a second metallization layer on top of a first metallization layer that is disposed on a semiconductor stack, can provide a vertical electrical interconnection for a memory element, such as a Phase Change Memory element (PCM) or a Resistive RAM element (RRA), integrated into a BEOL metallization layers fabrication process. The terms memory element, Phase Change Memory element, PCM element, PCM, Resistive RAM element, RRA element, RRA, and the like, may be used interchangeably in this disclosure, and are intended to individually, or collectively, be broadly interpreted to mean one or more memory elements that each includes a memory element material interposed between two electrodes.

The novel semiconductor fabrication of a vertical via structure that includes a memory element in the vertical via structure, is an attractive approach for maximizing utilization of real estate (both vertically and horizontally) in semiconductor structures which may comprise one or more circuit supporting substrates, integrated circuit chips, semiconductor devices, semiconductor wafers, and the like.

The novel fabrication process and structure also can reduce the cost of semiconductor fabrication by integrating a memory element into a vertical via in a BEOL fabrication that can be quick and efficient. For example, a multiple use via fabrication process can fabricate multiple vertical vias using a single exposure, as will be discussed in detail below. One or more of the vertical vias can each include a memory element inside the vertical via, as will be discussed below. The inventors have observed that current semiconductor fabrication processes for integrating memory elements in a semiconductor stack can be inefficient and require multiple exposures, which increase semiconductor fabrication costs. The new and novel multiple uses via fabrication process, that integrates a memory element into one or more vertical vias in a BEOL fabrication, can avoid the disadvantages of current semiconductor fabrication processes as discussed above.

It should be noted that semiconductor circuit designs and physical layouts can include a plurality of metallization layers stacked on top of one another in a material stack. A metallization layer may also be referred to as a back-end-of-line (BEOL) metallization layer, which could be disposed on top of a semiconductor material stack.

Various types of conductive materials and/or metals can be used, in various embodiments of the invention, such as in: electrical contacts, electrodes, and metal wiring, according to various circuit design and layout implementation goals and requirements. Copper and Tungsten metals have been popularly used for circuit implementations. While Copper has been used and continues to be used in many semiconductor circuit design implementations, Cobalt has certain advantages as the pitch values become much smaller with tighter pitch tolerances between features in each of several layers on top of each other in a material stack. In view of the above, it should be clear that various types of conductive materials and/or metals can be used in various embodiments of the invention, without departing from the scope of the invention.

Referring now to the drawings in which like numerals represent the same or similar elements, a first example semiconductor fabrication process generally corresponds to the process steps shown in FIGS. 1 to 6 and 8 to 15. A second example semiconductor fabrication process generally corresponds to the process steps shown in FIGS. 7 and 16. The second example process may also include various steps shown in other figures used to discuss the first example semiconductor fabrication process as will be discussed below. These two example semiconductor fabrication processes will be discussed in more detail below.

In the first and second example fabrication processes, a semiconductor structure 100 comprises a semiconductor stack disposed on a semiconductor substrate. These structures are not shown in the figures. The semiconductor substrate can additionally be supporting electronic circuits. A plurality of electronic devices may be in a circuit disposed on the circuit supporting substrate, in which one or more electronic devices in the plurality of electronic devices comprises a first field-effect transistor (FET) and a second FET. One or more of these FETs can be electrically connected to metallization contacts in BEOL metallization layers disposed on the semiconductor stack.

The semiconductor structure 100 includes a metallization material stack that includes a first metallization layer 102 (which may also be referred to as a bottom metallization layer) disposed directly on the semiconductor stack. The metallization material stack also includes a second metallization layer 106 (which in certain embodiments may also be referred to as a top metallization layer) disposed on the first metallization layer 102. The first and second metallization layers can consist of patterned metal layer 105 and 103 embedded inside insulation layers. It should be noted that while the metallization material stack can include the second metallization layer 106 disposed directly on the first metallization layer 102, in various embodiments the metallization material stack could include one or more intervening metallization layers between the first and second metallization layers 102, 106. That is, the second metallization layer 106 would be disposed on one or more intervening metallization layers, or other material layers, which would be disposed on the first metallization layer 102.

As illustrated in FIG. 1, a dielectric insulating layer 104 (also may be referred to as a dielectric cap layer or a dielectric layer) can separate the second metallization layer 106 from the first metallization layer 102, as shown. The dielectric cap layer 104 can be used to separate at least some metal wiring, circuits, and junctions, in the second metallization layer 106 from making direct electrical contact with metal wiring, circuits, and junctions, in the first metallization layer 102. The dielectric cap layer 104 would be removed at selected locations to allow electrical interconnection, e.g., wiring and junctions, to extend from the second metallization layer 106 down to the first metallization layer 102, and/or further below to a semiconductor stack (not shown). The dielectric cap layer 104 may include, for example, dielectric material such as silicon oxide or carbon-doped oxide, or other low K dielectrics. Various dielectric materials may be used for the dielectric cap layer 104, according to various embodiments of the present invention.

A first metallization contact 103 and a third metallization contact 105 are laid out along with other features in the first metallization layer. The metallization contacts 103, 105, in this example can be made of Tungsten or Copper.

The semiconductor fabrication process, according to the present example, deposits a hard mask 108, such as metal, on the second metallization layer 106. The metal hard mask 108 is patterned such that it creates a boundary for an etching process, as will be discussed in more detail below.

Figure 2:
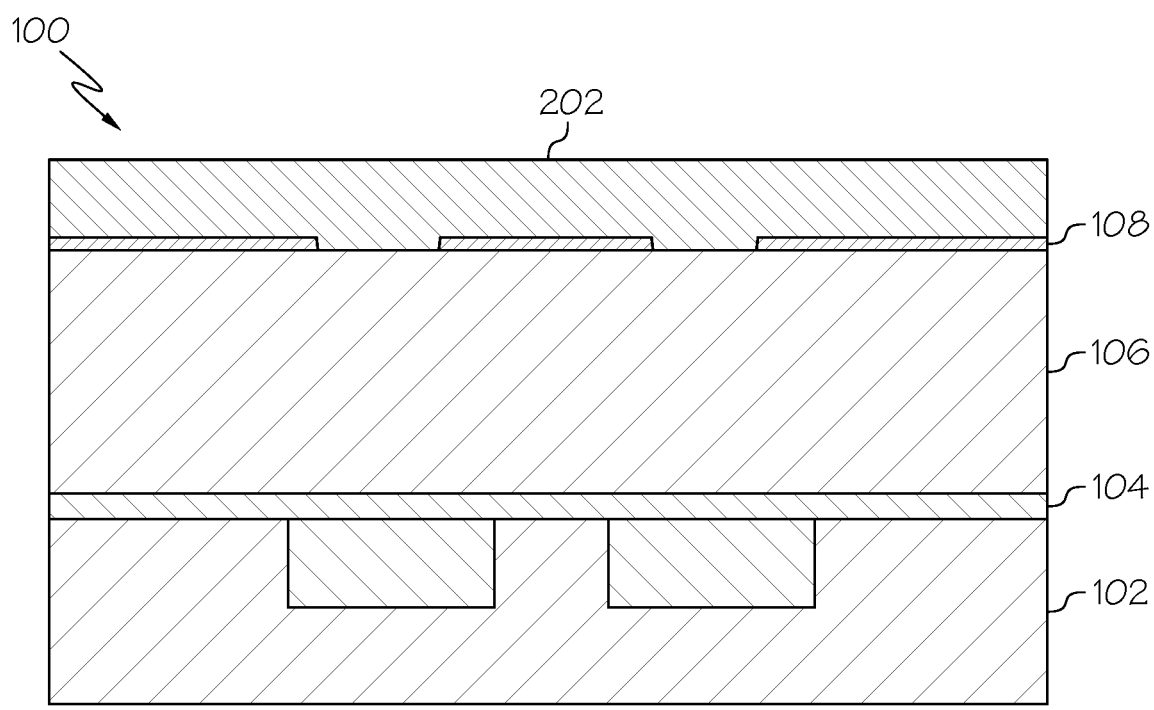
FIG. 2 is a cross-sectional side view of the partial semiconductor structure of FIG. 1 at a subsequent point in the example fabrication process.

Referring to FIG. 2, the semiconductor fabrication process according to the present example forms an etching patterning hard mask layer 202 on top of the metal hard mask layer 108 which is disposed on the second metallization layer 106. The etching patterning mask layer 202 can comprise Nitride. It may comprise, in certain embodiments, a photolithography material stack (OPL layer) 202.

Figure 3:
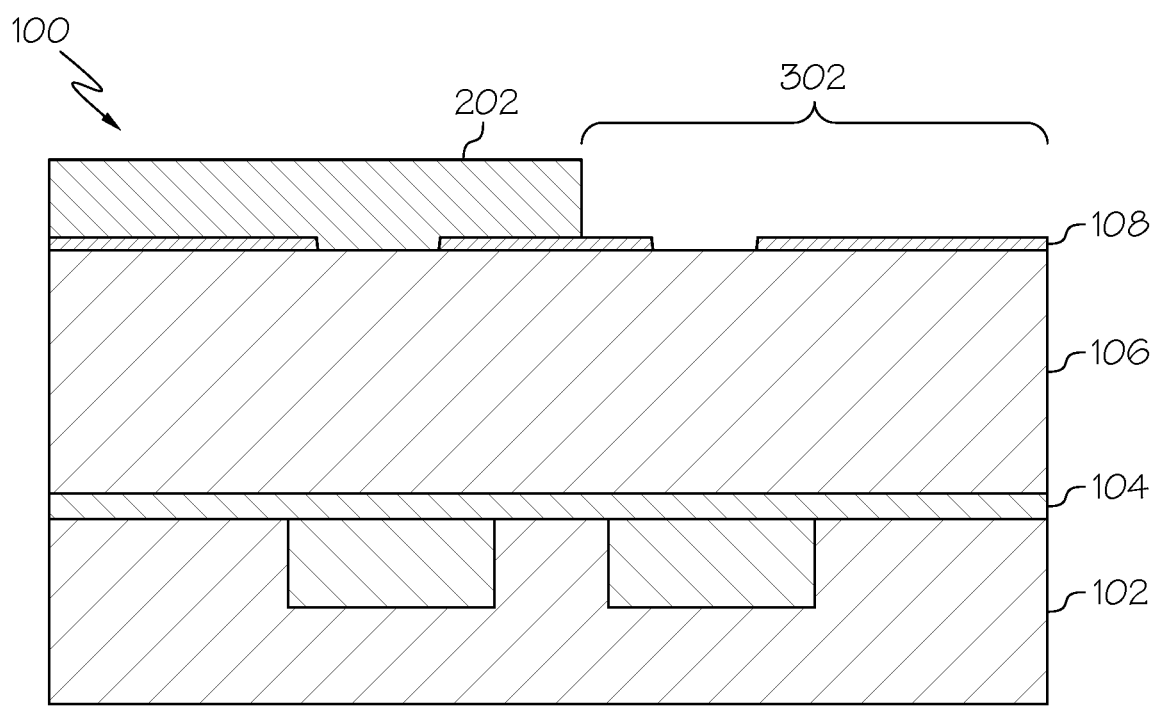
FIG. 3 is a cross-sectional side view of the partial semiconductor structure of FIG. 2 at a subsequent point in the example fabrication process.

The semiconductor fabrication process, as shown in FIG. 3, patterns an opening 302 in the etching patterning hard mask layer 202, selective to the metal hard mask 108. The opening 302 in the etching patterning hard mask layer 202, and an opening in the metal hard mask layer 108, provide a guide for via patterning of a vertical via trench.

Figure 4:
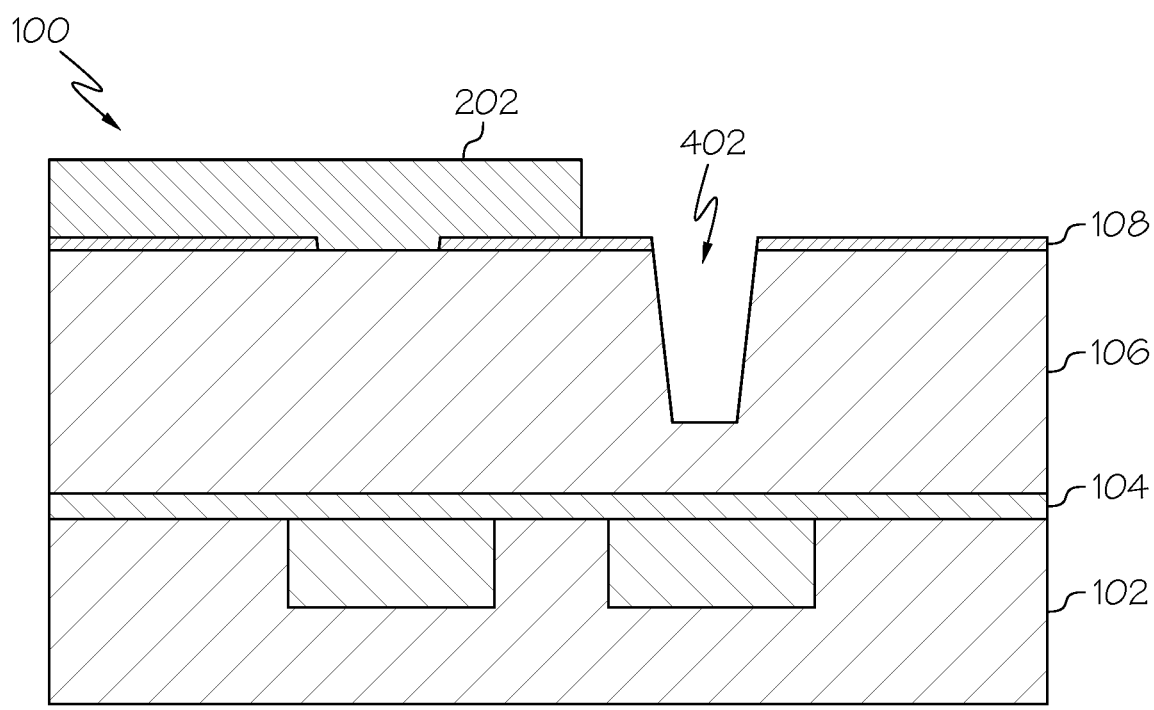
FIG. 4 is a cross-sectional side view of the partial semiconductor structure of FIG. 3 at a subsequent point in the example fabrication process.

As shown in FIG. 4, a first vertical via trench 402 can be formed by a first vertical directional etching process, such as using a reactive ion etching (RIE) process that etches into the second metallization layer 106. An example of a reactive ion etching (RIE) uses fluoride based chemistry (for example, the chemistry could include mixtures of Ar, $CHF_3$, $C_4F_8$ and $CF_4$, etc.). However, there are many alternative vertical etching processes that could be used. The first vertical via trench etching process, according to the present first example semiconductor fabrication process, stops in the second metallization layer 106 and does not etch through the dielectric layer 104. It should be noted that in the second example semiconductor fabrication process, the vertical via trench etching process continues etching through the dielectric layer 104 as will be discussed in more detail below.

Figure 5:
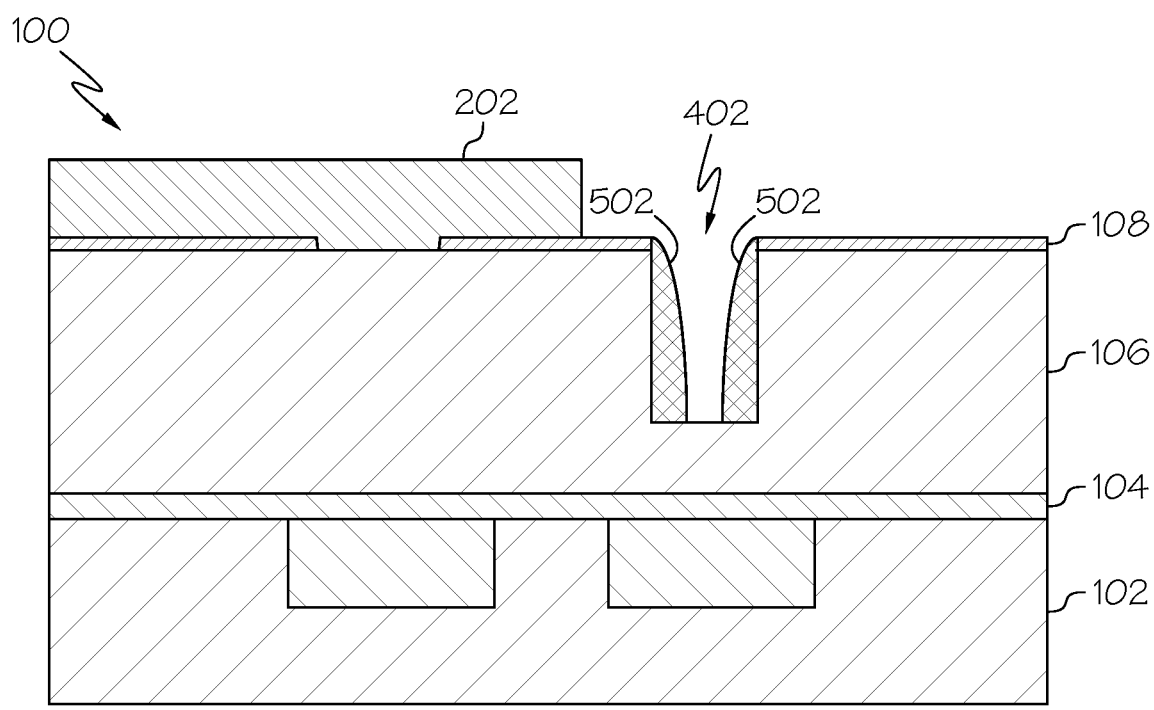
FIG. 5 is a cross-sectional side view of the partial semiconductor structure of FIG. 4 at a subsequent point in the example fabrication process.

As shown in FIG. 5, vertical sidewall spacers 502 can be selectively formed on the sidewall surfaces in the first vertical via trench 402. The vertical sidewall spacers 502 can be deposited by physical vapor deposition (PVD), chemical vapor deposition (CVD), selective chemical vapor deposition (selective CVD), or an atomic layer deposition (ALD), process that deposits material on the sidewalls and other surfaces and then etch away from other surfaces leaving only materials on the first vertical via trench 402, as shown in FIG. 5. The formation of the vertical sidewall spacers 502 on the sidewall surfaces in the first vertical via trench 402 is an optional step in the example semiconductor fabrication process. In various embodiments, such as in the second example semiconductor fabrication process, the via trench etching process continues etching through the dielectric layer 104 without formation of the vertical sidewall spacers 502, as will be discussed in more detail below.

Figure 6:
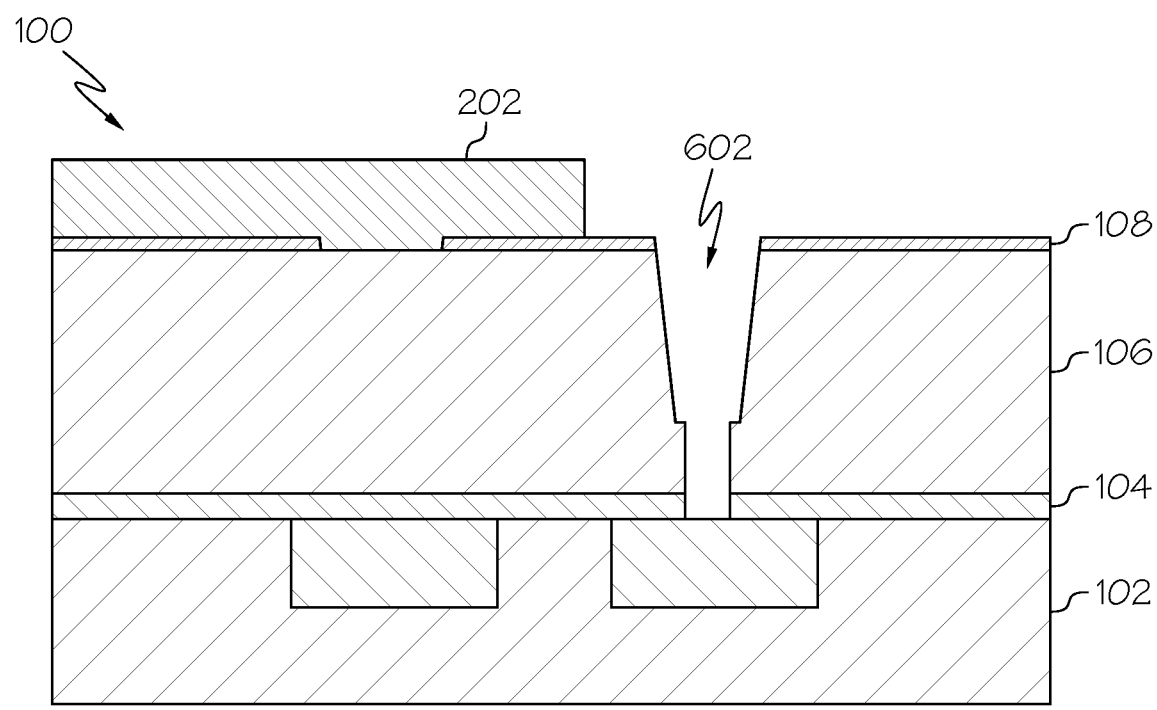
FIG. 6 is a cross-sectional side view of the partial semiconductor structure of FIG. 5 at a subsequent point in the example fabrication process.

A second vertical directional etching process, such as comprising a reactive ion etching (RIE) process, vertically etches between the vertical sidewall spacers 502 in the first vertical via trench 402 and through the dielectric layer 104 to a top surface of the first metallization contact 103 in the first metallization layer 102. This second vertical directional etching can be done using a reactive ion etching (RIE) process that etches through the second metallization layer 106 and the dielectric layer 104 to a top surface of the first metallization contact 103. However, there are many alternative vertical etching processes that could be used. After the second vertical directional etching, the vertical sidewall spacers 502 are stripped from, and thereby exposing, the vertical sidewall surfaces in the first vertical via trench 402, 602, as shown in FIG. 6. The vertical sidewall spacers 502 can be stripped using a suitable wet etch process, a suitable dry etch process, or another etching process. For example, the vertical sidewall spacers 502 can be stripped using a dry etch process such as using oxygen plasma.

Figure 7:
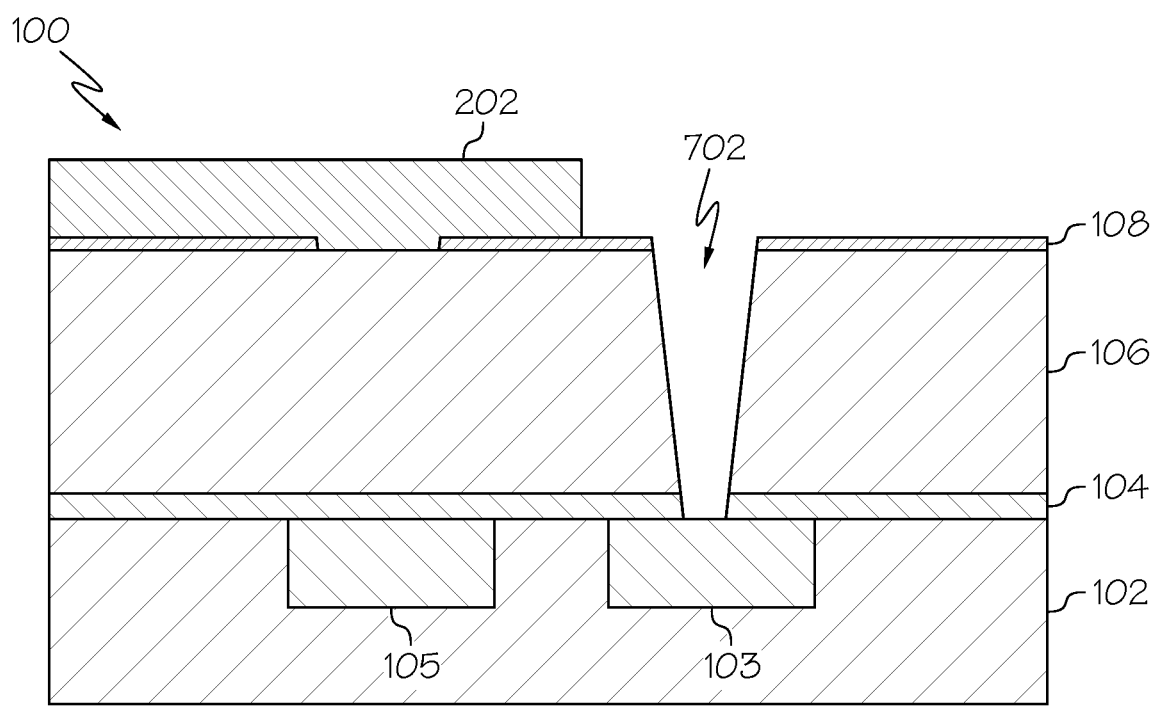
FIG. 7 is a cross-sectional side view of a partial semiconductor structure at a point in an example fabrication process, according to a second embodiment of the invention.
Figure 8:
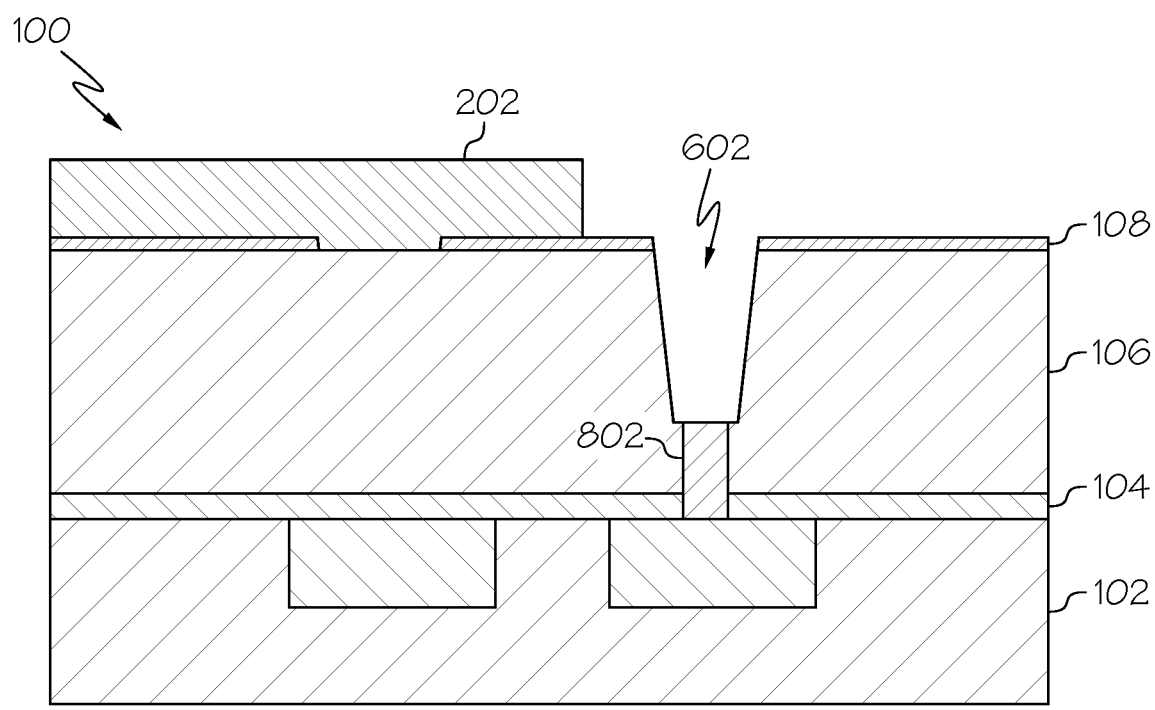
FIG. 8 is a cross-sectional side view of the partial semiconductor structure of FIG. 6 at a subsequent point in the example fabrication process.

FIG. 7 illustrates a second example semiconductor fabrication process in which the vertical via trench etching process, as discussed with reference to FIG. 4, continues etching a first vertical via trench 702 through the dielectric layer 104 to the top surface of the first metallization contact 103. Vertical via sidewalls in this first vertical via trench 702 are tapered downward at a generally continuous tapering rate from a top surface of the second metallization layer 106 to a bottom surface of the second metallization layer 106, as shown in FIG. 7.

It should be noted that the first example semiconductor fabrication process, as has been discussed above with reference to FIGS. 4, 5, and 6, etches a first vertical via trench 402, 602 with an upper via portion and a lower via portion. The upper via portion has vertical sidewalls tapered downward at a first tapering rate, while the lower via portion has vertical sidewalls tapered downward at a second tapering rate which is different from the first tapering rate. As shown in FIG. 6, the first tapering rate is greater than the second tapering rate. That is, the general angle of the vertical sidewalls in the upper via portion is shallower (lower to the horizontal plane of the second metallization layer) relative to the lower via portion, while the general angle of the vertical sidewalls in the lower via portion is steeper (higher from the horizontal plane of the second metallization layer) relative to the upper via portion. Two distinct via portions, i.e., an upper via portion and a lower via portion, are formed in the first vertical via trench 402, 602 as shown in FIG. 6.

Continuing with the discussion of the first example semiconductor fabrication process with reference to FIG. 6, the process continues by optionally forming a dielectric liner/barrier film (not shown) directly on the exposed vertical sidewall surfaces in the first vertical via trench 602, while not on the exposed top surface of the metallization contact 103. This liner/barrier film can be removed from the top surface of the first metallization contact 103 by a vertical directional etching process. Additionally, the dielectric liner/barrier film may be formed on the top surface of the upper layer 108 of the material stack 102, 104, 106, 108, in the BEOL metallization layers.

The dielectric liner/barrier film can include, for example, a Silicon Nitride film deposited and formed across the walls of the vertical via trench opening 602. The liner/barrier film can be, for example, a conformal Silicon Nitride deposition on the side walls of the vertical via trench opening 602. However, other material can be used for deposition to form the liner/barrier film. The liner deposition is primarily by a chemical vapor deposition (CVD) technique. The Silicon Nitride deposition for the barrier film, according to the example, is primarily by an atomic layer deposition (ALD) process that deposits material on the sidewalls of the vertical via trench opening 602, as shown in FIG. 6. It should be noted that in the second example semiconductor fabrication process, as shown in FIG. 7, there can also be an optional formation of a dielectric liner/barrier film (not shown) directly on the exposed vertical sidewall surfaces in this first vertical via trench 702, similar to the dielectric liner/barrier film discussed above with reference to FIG. 6.

After performing the vertical directional etching to form the first vertical via trench 602, according the example, and following an optional deposition of the dielectric liner/barrier film, a fill metal deposition process fills a portion of the vertical via trench 602 to form a lower electrode 802 in the first vertical via trench 602. The lower electrode 802 is formed, according to the example, by depositing a composition of Tantalum Nitride and Tungsten (TaN, W), then planarizing the top surface of the lower electrode 802 using a chemical mechanical planarization (CMP) process that polishes and removes the excess metal from the top surface of the lower electrode 802 and recesses the top surface.

Figure 9:
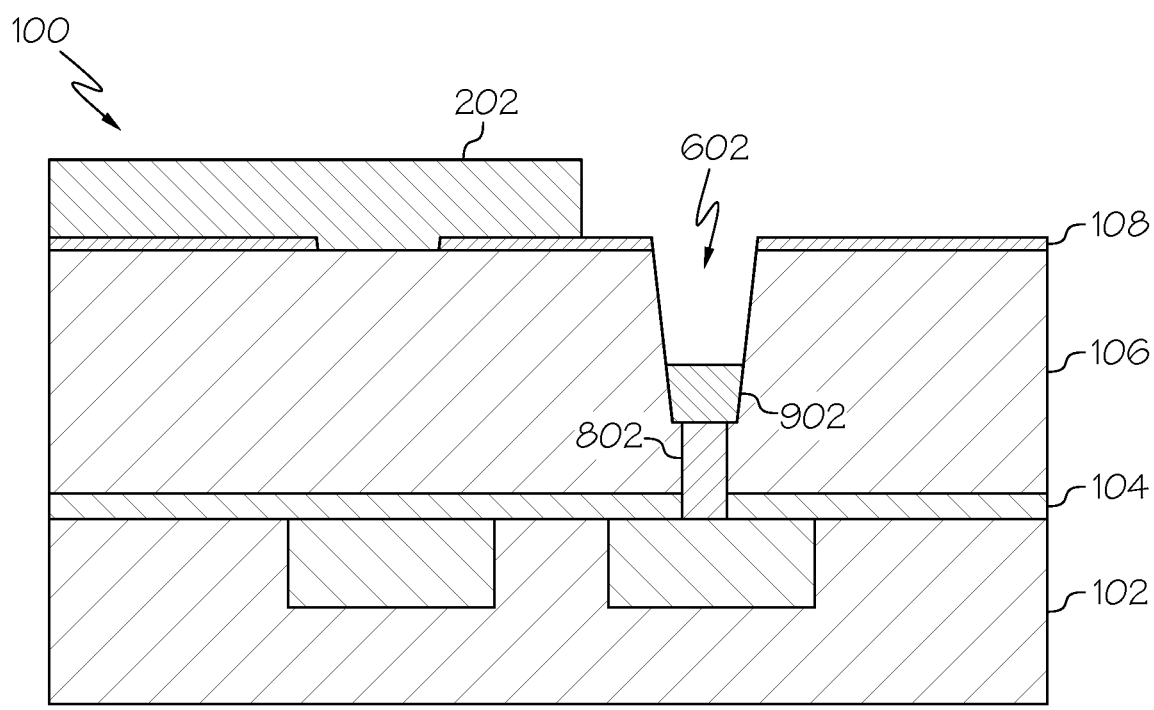
FIG. 9 is a cross-sectional side view of the partial semiconductor structure of FIG. 8 at a subsequent point in the example fabrication process.

The first example semiconductor fabrication process continues, as shown in FIG. 9, by depositing PCM material 902 in the first vertical via trench 602 directly on the top surface of the lower electrode 802. The process, according to the example, then planarizes the top surface of the PCM material 902 using a chemical mechanical planarization (CMP) process that polishes and removes excess PCM material from the top surface of the PCM material 902 and recesses the top surface.

Figure 10:
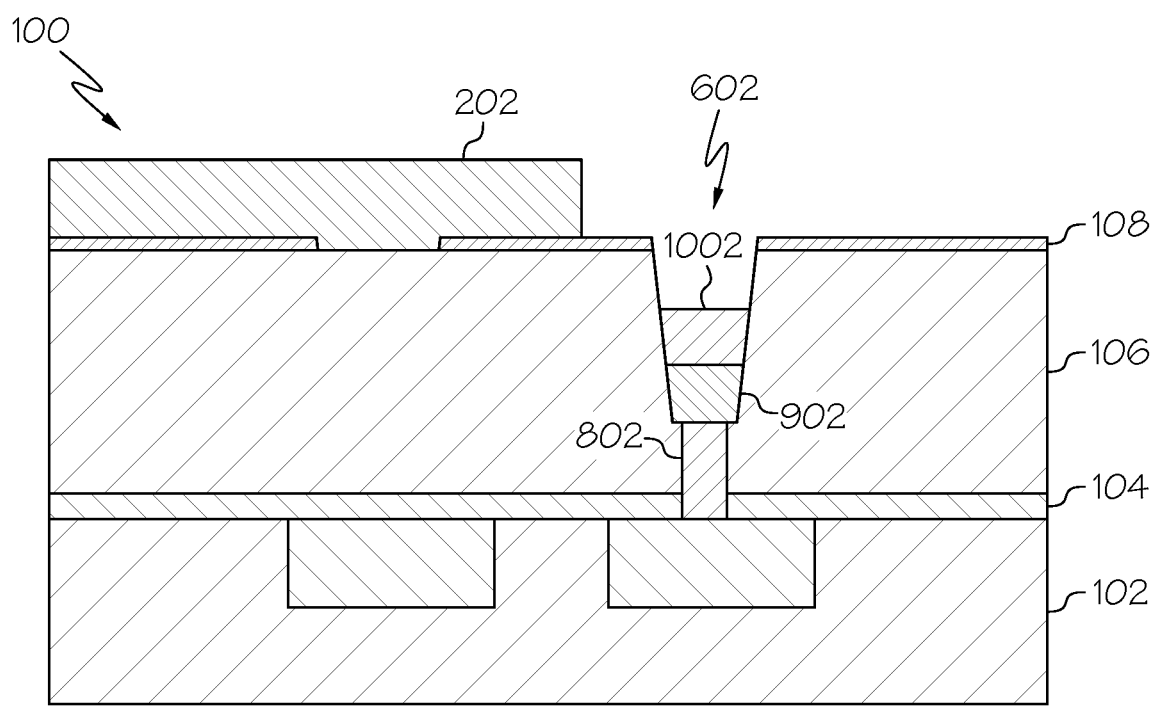
FIG. 10 is a cross-sectional side view of the partial semiconductor structure of FIG. 9 at a subsequent point in the example fabrication process.

The first example semiconductor fabrication process continues, as shown in FIG. 10, by a fill metal deposition process that fills a portion of the first vertical via trench 602 to form an upper electrode 1002 in the first vertical via trench 602. The upper electrode 1002 is formed, according to the example, by depositing a composition of Tantalum Nitride and Tungsten (TaN, W), then planarizing the top surface of the upper electrode 1002 using a chemical mechanical planarization (CMP) process that polishes and removes the excess metal from the top surface of the upper electrode 1002 and recesses the top surface. It should be noted that in the current example process, the lower electrode 802 of the PCM element, is formed in the lower via portion, while the upper electrode 1002 and the PCM material layer 902 are formed in the upper via portion in the first vertical via trench 602. However, other arrangements are possible according to various embodiments. As a first example, all three component layers of the PCM element, i.e., the lower electrode 802, the PCM material layer 902, and the upper electrode 1002, can be formed in the lower via portion in the first vertical via trench 602. According to a second example, all three component layers of the PCM element can be formed in the upper via portion of the first vertical via trench 602. As a third example, the lower electrode 802 and the PCM material layer 902 can be formed in the lower via portion, while the upper electrode 1002 can be formed in the upper via portion. It is also noted that other material as desired can be used instead of PCM material 902.

Figure 11:
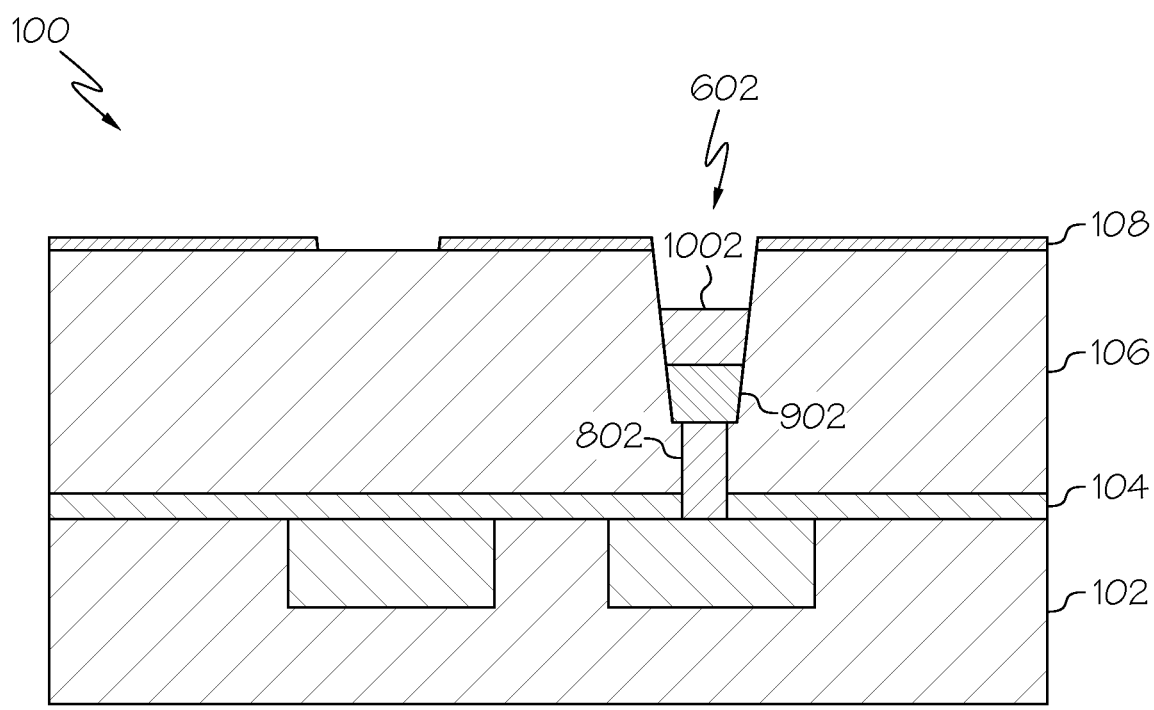
FIG. 11 is a cross-sectional side view of the partial semiconductor structure of FIG. 10 at a subsequent point in the example fabrication process.

Continuing with the process, with reference to FIG. 11, the remaining etching patterning hard mask layer 202, which in certain embodiments may be a photolithography material stack (OPL layer) 202, is removed from the top surface of the second metallization layer 106, by using a dry etch process such as an oxygen plasma. In another instance, the remaining etching patterning hard mask layer 202 can be removed by using a suitable wet-etchant. The removal of the remaining etching patterning hard mask layer 202 exposes a second opening in the metal hard mask layer 108. The exposed second opening in the metal hard mask layer 108 provides a guide for via patterning of a second vertical via trench.

Figure 12:
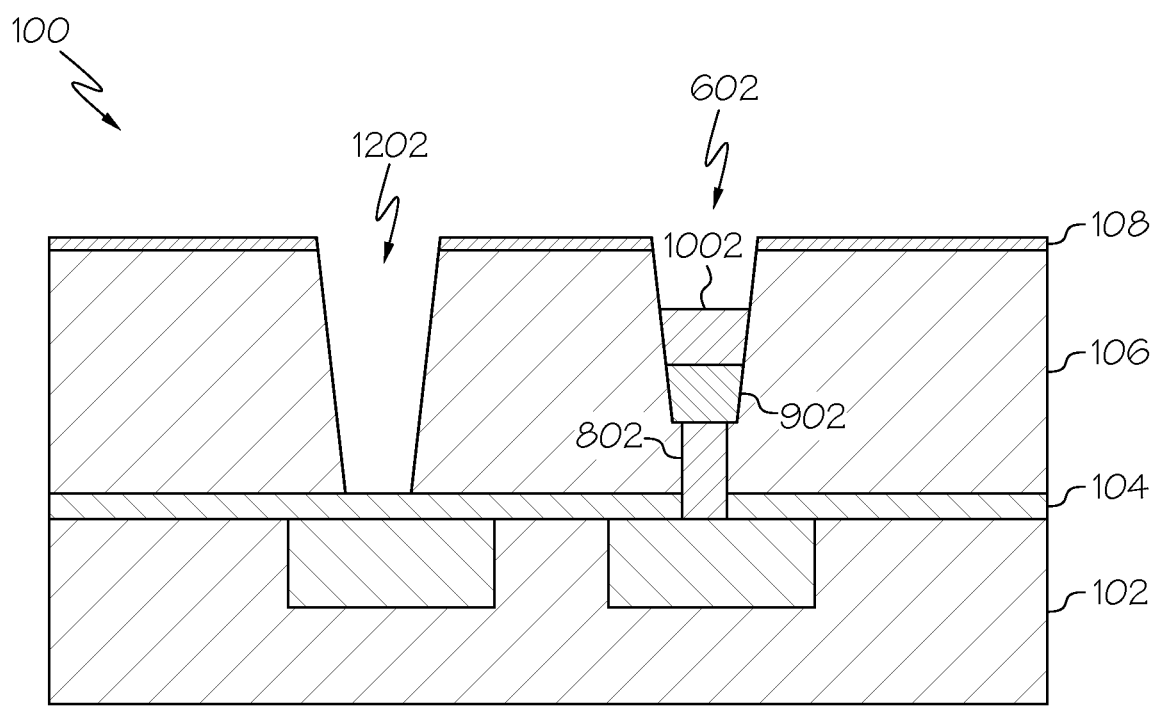
FIG. 12 is a cross-sectional side view of the partial semiconductor structure of FIG. 11 at a subsequent point in the example fabrication process.

As shown in FIG. 12, a second vertical via trench 1202 can be formed by a third vertical directional etching process, such as using a reactive ion etching (RIE) process that etches into the second metallization layer 106. An example of a reactive ion etching (RIE) uses fluoride based chemistry (for example, the chemistry could include mixtures of Ar, $CHF_3$, $C_4F_8$ and $CF_4$, etc.). However, there are many alternative vertical etching processes that could be used. The third vertical via trench etching process, according to the present example, etches through the second metallization layer 106 and stops at a top surface of the dielectric layer 104. Vertical via sidewalls in the second vertical via trench 1202 are tapered downward at a generally continuous tapering rate from a top surface of the second metallization layer 106 to a bottom surface of the second metallization layer 106, similar to the general downward tapering of the vertical via sidewalls in the first vertical via trench 702 of the second example semiconductor fabrication process, as shown in FIG. 7.

Figure 13:
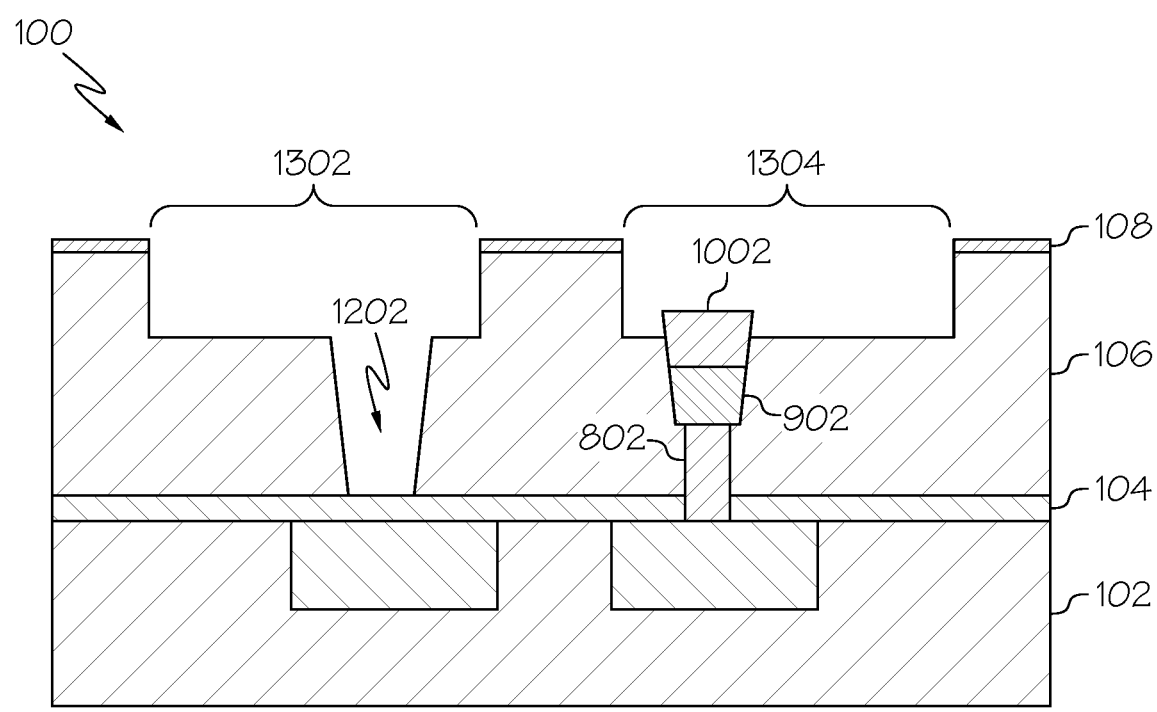
FIG. 13 is a cross-sectional side view of the partial semiconductor structure of FIG. 12 at a subsequent point in the example fabrication process.

Then, continuing with the first example semiconductor fabrication process as shown in FIG. 13, the metal hard mask layer 108 is patterned such that it creates openings 1302, 1304, that provide a guide for etching the second metallization layer 106 to form metallization contacts in the second metallization layer 106. The openings 1302, 1304, are formed in the metal hard mask layer 108 horizontally across the second metallization layer 106. These openings 1302, 1304, can be formed using a fourth reactive ion etching (RIE) vertical directional etching process, or another suitable vertical directional etching process. The metallization contact trenches 1302, 1304, extend horizontally in the second metallization layer 106 at least across the etched second vertical via trench 1202 and across the upper electrode 1002 in the first vertical via trench 402, 602.

The vertical directional etching process, according to the example, may be followed by a wet cleaning process to clean the exposed surfaces in the metallization contact trenches 1302, 1304, and in the vertical via trench 1202. The wet cleaning may or may not include dilute hydrofluoric acid (DHF) and/or chemistries containing oxidizers, such as peroxides.

Figure 14:
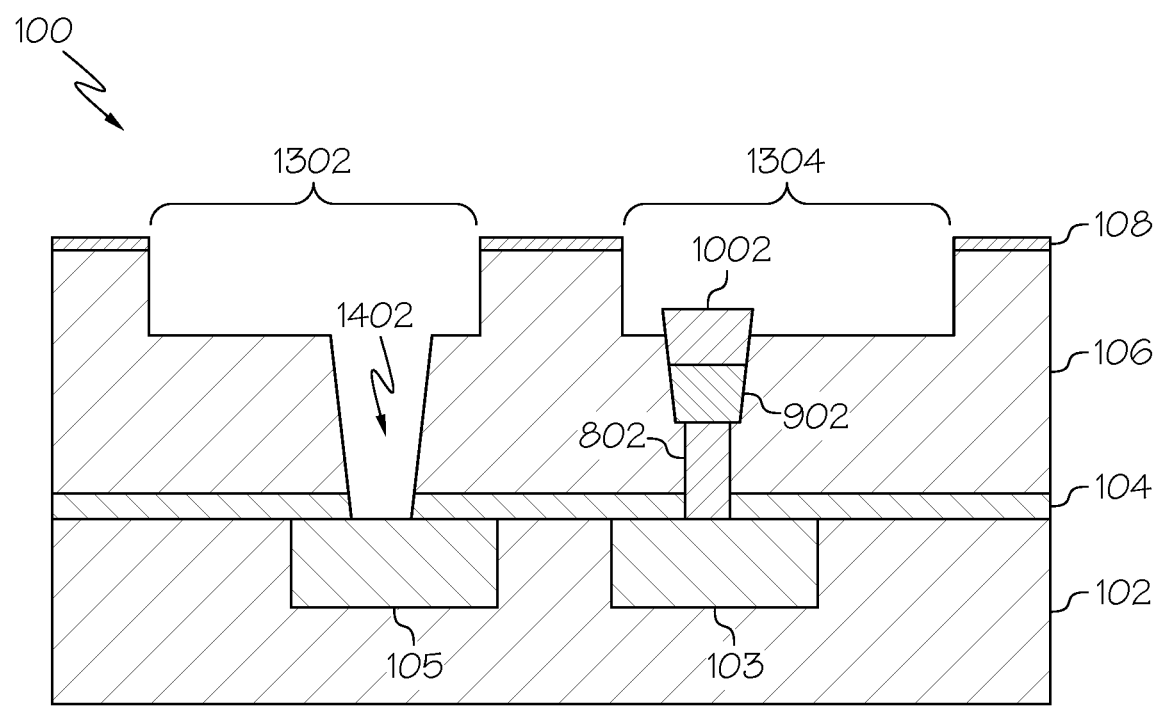
FIG. 14 is a cross-sectional side view of the partial semiconductor structure of FIG. 13 at a subsequent point in the example fabrication process.

With reference to FIG. 14, the first example semiconductor fabrication process continues by performing vertical directional etching in the second vertical via trench 1402 and etching through the dielectric layer 104 to a top surface of the third metallization contact 105 in the first metallization layer 102. A reactive ion etching (RIE) vertical directional etching process, or another suitable vertical directional etching process, can be used to etch in the second vertical via trench 1402 and etching through the dielectric layer 104 to a top surface of the third metallization contact 105.

After the etching of dielectric layer 104, according to the example, a conductive liner/barrier film (not shown) can be optionally formed directly on the exposed surfaces in the metallization contact trenches 1302, 1304, and in the vertical via trench 1202. Additionally, the conductive liner/barrier film is formed on the top surface of the second metallization layer 106.

The conductive liner/barrier film (not shown) can include, for example, a Titanium Nitride film deposited and formed across the walls of the metallization contact trenches 1302, 1304, and in the vertical via trench 1202, 1402. The conductive liner/barrier film can be, for example, a conformal Titanium Nitride, a TaN/Ta bilayer, a Ti or TiN layer, or combinations of these materials deposited on the walls of the metallization contact trenches 1302, 1304, and in the vertical via trench 1202. The conductive liner/barrier film deposition, according to the example, is primarily by a physical vapor deposition (PVD) technique, though processes such as ALD or CVD can be used as well. The deposition process should be performed such that it deposits material on the vertical sidewalls of the metallization contact trenches 1302, 1304, and on the vertical sidewalls of the vertical via trench 1202.

As shown in FIG. 14, after the optional deposition of the conductive liner/barrier film in the metallization contact trenches 1302, 1304, and in vertical via trench 1402, 1202, a deposition of a metal gap fill in the metallization contact trenches 1302, 1304, and in vertical via trench 1402, 1202, forms a trench metal to provide a fourth metallization contact 1502 and a second metallization contact 1504 in the metallization contact trenches 1302, 1304, and a vertical via in the vertical via trench 1402, 1202 that completes metallization of an interconnect wire electrically interconnecting the fourth metallization contact 1502 in the second metallization layer 106 with the third metallization contact 105 in the first metallization layer 102. In this example, this metal gap fill is deposited by PVD Copper seed followed by Copper plating, though chemical vapor deposition (CVD) techniques could be used as well. The metal gap fill can include any metal suitable for forming the trench metal via wire on the conductive liner/barrier film in the second vertical via trench 1202, 1402, as shown in FIG. 14. For example, the trench metal via wire can be made of Copper metal. Several examples of metal that can be used as the metal gap fill include: Copper, Cobalt, Tungsten, Aluminum or any combination thereof. However, other metals could also, or alternatively, be used in the trench metal via wire, as shown in the example shown in FIGS. 14 and 15. The metal can be polished to planarized and also remove metal hard mask 108 at the same time.

Figure 15:
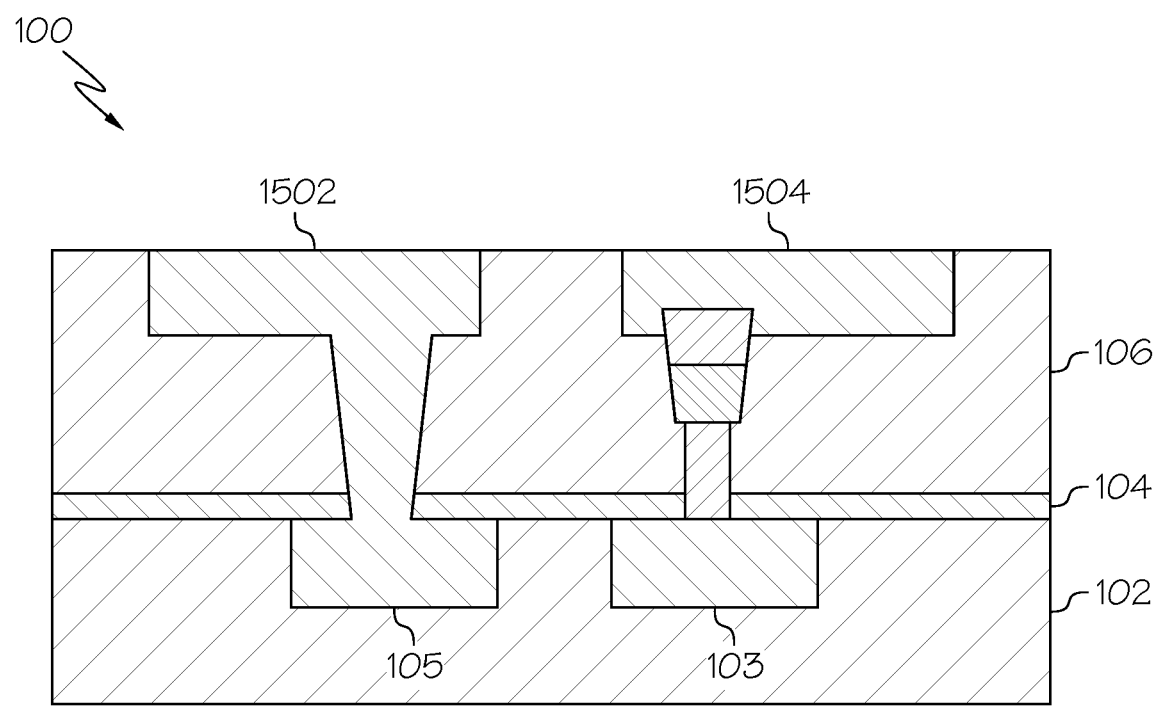
FIG. 15 is a cross-sectional side view of the partial semiconductor structure of FIG. 14 at a subsequent point in the example fabrication process.

As shown in FIG. 15, the second metallization contact 1504 is electrically connected with the upper electrode 1002 of the PCM element 1002, 902, 802. The first metallization contact 103 is electrically connected with the lower electrode 802 of the PCM element 1002, 902, 802. It should be noted that, while not explicitly shown in FIG. 15, according to various embodiments, a PCM heater element can be disposed in close thermal coupling with the lower electrode 802 of the PCM element 1002, 902, 802. In certain embodiments, the PCM heater element can be disposed in the first vertical via trench 602, coupled with vertical via metal in the first vertical via trench 602, and electrically connected to the lower electrode 802 of the PCM element 1002, 902, 802.

Figure 16:
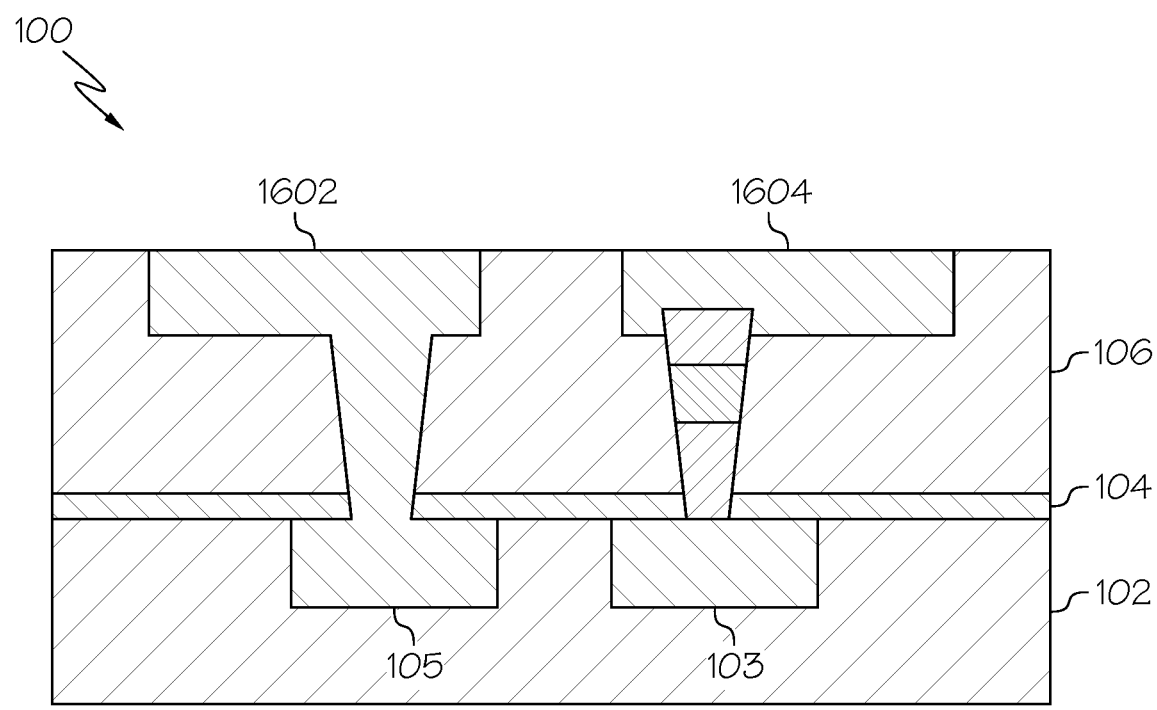
FIG. 16 is a cross-sectional side view of the partial semiconductor structure of FIG. 7 at a subsequent point in the example fabrication process, according to the second embodiment of the invention.

FIG. 16 illustrates, according to the second example embodiment, the resulting multiple vertical via semiconductor structure 100, that has been discussed above with reference to FIG. 7. Similar and analogous to the semiconductor structure 100 in the first example embodiment as shown in FIG. 15, the second example embodiment semiconductor structure 100 includes a first metallization contact 103 and a third metallization contact 105, in the first metallization layer 102, and a second metallization contact 1604 and a fourth metallization contact 1602, in the second metallization layer 106. A vertical via metal wire in the second vertical via trench 1202, 1402, electrically interconnects the fourth metallization contact 1602 in the second metallization layer 106 with the third metallization contact 105 in the first metallization layer 102. The second metallization contact 1604 is electrically connected with the upper electrode 1002 of the PCM element 1002, 902, 802. The first metallization contact 103 is electrically connected with the lower electrode 802 of the PCM element 1002, 902, 802.

According to the examples, as shown in FIGS. 15 and 16, a first vertical via (formed in the first vertical via trench 602, 702) and a second vertical via (formed in the second vertical via trench 1202, 1402) are substantially a same vertical height in the second metallization layer 106. That is, the two vertical vias extend from a bottom surface of the second metallization layer 106 to a substantially same height in the second metallization layer 106.

It should be noted that, while not explicitly shown in FIG. 16, according to various embodiments, a PCM heater element can be disposed in close thermal coupling with the lower electrode 802 of the PCM element 1002, 902, 802. In certain embodiments, the PCM heater element can be disposed in the first vertical via trench 702 (see FIG. 7), coupled with vertical via metal in the first vertical via trench 702, and electrically connected to the lower electrode 802 of the PCM element 1002, 902, 802.

There will be a certain overburden of metal on top of the wafer from the CVD deposition of the metal gap fill. Some of the conductive liner/barrier film may have been formed on the top surface of the wafer. The semiconductor fabrication process, according to the first and second example embodiments discussed above, performs a chemical mechanical planarization (CMP) process that polishes and removes the excess metal from the top of the wafer. In the present examples, the CMP process also removes the conductive liner/barrier film from the top surface of the second metallization layer 106 of the material stack 102, 104, 106, shown in FIGS. 15 and 16. In the semiconductor structure 100, according to the certain embodiments that include a conductive liner/barrier, the conductive liner/barrier film will solely be present in the vertical via trenches 602, 702, 1202, 1402. The semiconductor structure 100, after performing the CMP process in the present examples, is shown in FIGS. 15 and 16.

Figure 17:
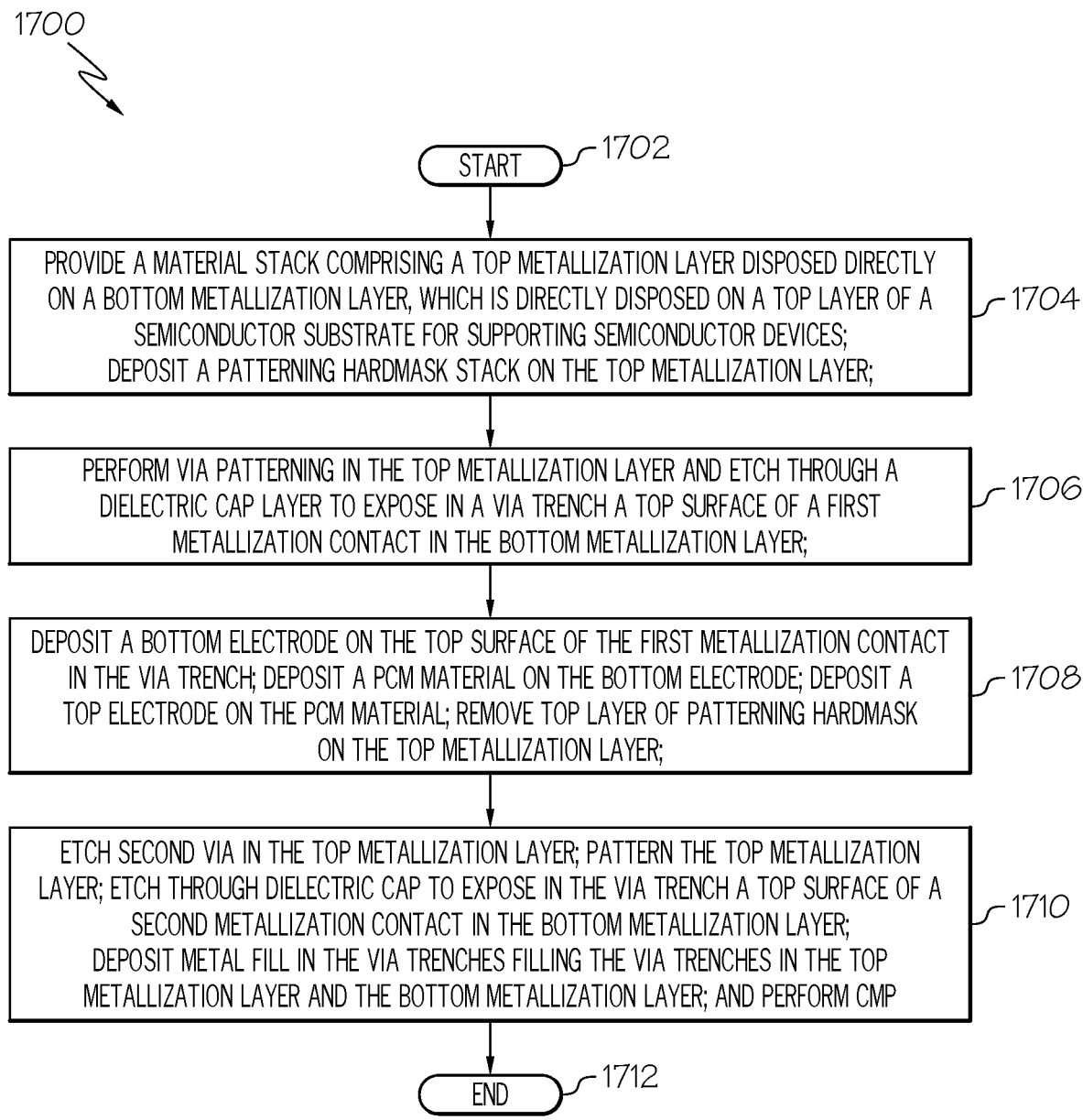
FIG. 17 is an operational flow diagram illustrating an example fabrication process, according to various embodiments of the invention.

In accordance with an example semiconductor fabrication process 1700, as shown in FIG. 17, a fabrication flow diagram is entered, at step 1702, which then immediately proceeds to step 1704. In a metallization region of a semiconductor structure 100 with a substrate for supporting electronic devices, as shown in FIG. 1, provided is a material stack according to one example, comprising a second (top or upper) metallization layer 106 disposed directly on a first (bottom or lower) metallization layer 102, which is directly disposed on a top layer of a semiconductor stack and substrate (not shown) for supporting semiconductor devices.

The semiconductor fabrication process performs deposition of a patterning hard mask stack 108, 202 on the top metallization layer 106. The process, at step 1706, performs via patterning in the top metallization layer 106 to form a vertical via trench opening 702 and expose in the via trench a top surface of a metallization contact 103 in the bottom metallization layer 102. The semiconductor fabrication process, at step 1708, performs selective deposition of conductive material to form a lower electrode 802 in the vertical via trench opening 702 on top of the exposed top surface of the metallization contact 103 in the bottom metallization layer 102.

The fabrication process, at step 1708, performs selective deposition of PCM material 902 in the first vertical via trench 702 directly on the top surface of the lower electrode 802. The fabrication process continues by performing selective deposition of selective deposition of conductive material to form an upper electrode 1002 in the vertical via trench opening 702 on top of the exposed top surface of the PCM material 902. The process then, at step 1708, removes the top layer of patterning hard mask 202 from the top of the upper metallization layer 106.

At step 1710, the semiconductor fabrication process performs a vertical directional etch in the top metallization layer 106 to form a second vertical via trench 1202. Then, a patterning etch is performed in the top metallization layer 106 to form metallization contact trenches 1302, 1304. A vertical directional etching is performed in the second vertical via trench 1202, 1402, etching through the dielectric cap layer 104 to expose a top surface of a second metallization contact 105 in the bottom metallization layer 102. An optional conductive liner/barrier layer is deposited on all exposed surfaces in the metallization contact trenches 1302, 1304. Metal gap fill is performed to fill the metallization contact trenches 1302, 1304, and the second vertical via trench 1202, 1402, with conductive material such as Copper. The metal gap fill forms two metallization contacts 1602, 1604, in the top metallization layer 106. Then, the process, at step 1710, performs a chemical mechanical planarization (CMP) process that polishes and removes the excess metal (conductive material) from the top of the wafer. The CMP process also removes the optional conductive liner/barrier film from the top surface of the second metallization layer 106.

An example of the resulting semiconductor structure 100, after performing the CMP process in the present example fabrication process, is shown in FIG. 16. The example semiconductor fabrication process is then exited, at step 1712.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
a first metallization layer disposed on a semiconductor stack on a substrate, the first metallization layer including a first metallization contact;
a second metallization layer disposed on the first metallization layer, the second metallization layer including a second metallization contact, and a dielectric layer vertically interposed between the first and second metallization layers;
a first single vertical via hole in the second metallization layer, the first single vertical via hole interconnecting, through the dielectric layer, the first and second metallization contacts, wherein at least a first portion of the first single vertical via hole in the second metallization layer is continuously tapered downward having a smaller diameter nearer to the substrate and a larger diameter farther from the substrate; and
inside the first portion of the first single vertical via hole in the second metallization layer, a phase change material non-volatile memory (PCM) is vertically interposed between an upper electrode, inside the first portion of the first single vertical via hole in the second metallization layer, and a lower electrode, also inside the first portion of the first single vertical via hole in the second metallization layer, the lower electrode electrically connected to the first metallization contact and the upper electrode electrically connected to the second metallization contact.

2. The semiconductor structure of claim 1, comprising:
a second single vertical via hole, separate from the first single vertical via hole, vertically interconnecting through the dielectric layer a third metallization contact in the first metallization layer with a fourth metallization contact in the second metallization layer.

3. The semiconductor structure of claim 2, wherein the first single vertical via hole and the second single vertical via hole are located adjacent to each other.

4. The semiconductor structure of claim 2, wherein the first single vertical via hole interconnecting, through a first opening in the dielectric layer, the first metallization contact in the first metallization layer with the second metallization contact in the second metallization layer, and the second single vertical via hole interconnecting, through a second opening in the dielectric layer, the third metallization contact in the first metallization layer with the fourth metallization contact in the second metallization layer.

5. The semiconductor structure of claim 2, wherein the dielectric layer separating the second metallization layer from the first metallization layer.

6. The semiconductor structure of claim 1, wherein the semiconductor stack disposed on the substrate includes a plurality of electronic devices in a circuit disposed on the circuit supporting substrate, a first electronic device in the plurality of electronic devices comprising a first field-effect transistor (FET) being electrically connected through the first single vertical via hole with the lower electrode.

7. The semiconductor structure of claim 1, comprising a PCM heater element disposed in close thermal coupling with the lower electrode.

8. The semiconductor structure of claim 7, wherein the PCM heater element is disposed inside the first single vertical via hole and electrically connected to the lower electrode.

9. The semiconductor structure of claim 1, comprising:
a second single vertical via hole, separate from the first single vertical via hole, vertically interconnecting through the dielectric layer a third metallization contact in the first metallization layer with a fourth metallization contact in the second metallization layer; and
wherein the first single vertical via hole and the second single vertical via hole are substantially a same vertical height in the second metallization layer.

10. The semiconductor structure of claim 1, wherein the first single vertical via hole includes a dielectric liner directly contacting vertical sidewall surfaces of the first single vertical via hole.

11. The semiconductor structure of claim 1, wherein the lower electrode being electrically connected through the first single vertical via hole with the first metallization contact in the first metallization layer, and the upper electrode being electrically connected through the first single vertical via hole with the second metallization contact in the second metallization layer.

12. The semiconductor structure of claim 1, wherein the at least a first portion of the first single vertical via hole includes an upper via portion disposed on top of a lower via portion, and wherein the upper via portion comprises upper vertical sidewalls tapered downward at a first positive tapering rate and the lower via portion comprises lower vertical sidewalls tapered downward at a second positive tapering rate, the first positive tapering rate being greater than the second positive tapering rate.

13. The semiconductor structure of claim 12, wherein the upper via portion of the first single vertical via hole includes therein the upper electrode and the phase change material non-volatile memory (PCM).

14. The semiconductor structure of claim 13, wherein the lower via portion of the first single vertical via hole including therein the lower electrode.

15. The semiconductor structure of claim 12, wherein the upper vertical sidewalls of the upper via portion are tapered downward at the first positive tapering rate from the second metallization contact to a start of the lower via portion and the lower via portion comprises lower vertical sidewalls tapered downward at a second positive tapering rate to the first metallization contact, the first positive tapering rate being greater than the second positive tapering rate.

16. The semiconductor structure of claim 15, comprising a second single vertical via hole, separate from the first single vertical via hole, vertically interconnecting through the dielectric layer a third metallization contact in the first metallization layer with a fourth metallization contact in the second metallization layer, and wherein the second single vertical via hole comprises vertical sidewalls tapered downward at the first tapering rate from the fourth metallization contact in the second metallization layer to the third metallization contact in the first metallization layer.

* * * * *